(12) United States Patent  
Franch et al.

(10) Patent No.: US 7,762,721 B2  
(45) Date of Patent: Jul. 27, 2010

(54) ON CHIP TEMPERATURE MEASURING AND MONITORING METHOD

(75) Inventors: Robert L. Franch, Wappingers Falls, NY (US); Keith A. Jenkins, Sleepy Hollow, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/061,692

(22) Filed: Apr. 3, 2008

(65) Prior Publication Data  
US 2008/0186035 A1 Aug. 7, 2008

Related U.S. Application Data

(62) Division of application No. 11/867,338, filed on Oct. 4, 2007, now abandoned, and a division of application No. 11/747,620, filed on May 11, 2007, now Pat. No. 7,452,128, and a division of application No. 10/824,297, filed on Apr. 14, 2004, now Pat. No. 7,255,476.

(51) Int. Cl.  
G01K 7/00 (2006.01)

(52) U.S. Cl. .................. 374/178; 374/170; 374/1; 257/48; 324/72; 702/99

(58) Field of Classification Search ......... 374/170–172, 374/178, 1; 702/130–136, 99; 327/512–513; 257/48; 324/72  
See application file for complete search history.

(56) References Cited

U.S. PATENT DOCUMENTS

| | | | | |
|---|---|---|---|---|
| 3,286,138 A * | 11/1966 | Shockley | ................. | 257/581 |
| 4,039,928 A * | 8/1977 | Noftsker et al. | ............. | 323/326 |
| 4,224,537 A | 9/1980 | Glazer | | |
| 4,395,139 A | 7/1983 | Namiki | | |
| 4,652,144 A * | 3/1987 | Gunther et al. | ............. | 327/512 |
| 4,672,175 A | 6/1987 | Niven | | |
| 4,768,170 A | 8/1988 | Hoff | | |
| 5,039,878 A * | 8/1991 | Armstrong et al. | .......... | 327/512 |
| 5,070,322 A * | 12/1991 | Fujihira | ..................... | 340/653 |
| 5,196,827 A | 3/1993 | Allen | | |
| 5,221,888 A * | 6/1993 | Moody | ........................ | 323/315 |
| 5,278,461 A | 1/1994 | Bucksch | | |
| 5,355,123 A * | 10/1994 | Nishiura et al. | ............. | 340/653 |
| 5,357,089 A * | 10/1994 | Prentice | ..................... | 330/298 |
| 5,546,041 A * | 8/1996 | Szajda | ........................ | 327/512 |
| 5,639,163 A | 6/1997 | Davidson et al. | | |
| 5,686,858 A * | 11/1997 | Malherbe | .................... | 327/512 |
| 5,748,429 A | 5/1998 | Peterson | | |
| 5,781,075 A | 7/1998 | Bolton | | |
| 5,796,290 A * | 8/1998 | Takahashi | .................... | 327/512 |
| 5,918,982 A * | 7/1999 | Nagata et al. | ............... | 374/178 |

(Continued)

*Primary Examiner*—Gail Verbitsky  
(74) *Attorney, Agent, or Firm*—Law Office of Charles W. Peterson, Jr.; Brian P. Verminski, Esq.

(57) ABSTRACT

A device temperature measurement circuit, an integrated circuit (IC) including a device temperature measurement circuit, a method of characterizing device temperature and a method of monitoring temperature. The circuit includes a constant current source and a clamping device. The clamping device selectively shunts current from the constant current source or allows the current to flow through a PN junction, which may be the body to source/drain junction of a field effect transistor (FET). Voltage measurements are taken directly from the PN junction. Junction temperature is determined from measured junction voltage.

8 Claims, 3 Drawing Sheets

U.S. PATENT DOCUMENTS

| | | |
|---|---|---|
| 5,973,382 A | 10/1999 | Burgener |
| 5,982,221 A | 11/1999 | Tuthill |
| 5,993,060 A | 11/1999 | Sakurai |
| 6,005,434 A | 12/1999 | Tsukikawa |
| 6,008,685 A | 12/1999 | Kunst |
| 6,019,508 A | 2/2000 | Lien |
| 6,049,244 A | 4/2000 | Milanesi |
| 6,166,584 A | 12/2000 | De |
| 6,225,851 B1 | 5/2001 | Descombes |
| 6,255,891 B1 | 7/2001 | Matsuno |
| 6,271,710 B1* | 8/2001 | Ooishi ......... 327/512 |
| 6,286,996 B1* | 9/2001 | Molander ......... 374/152 |
| 6,288,596 B1* | 9/2001 | Johansson et al. ......... 327/512 |
| 6,316,971 B1* | 11/2001 | Ohashi ......... 327/74 |
| 6,332,710 B1 | 12/2001 | Aslan |
| 6,363,490 B1 | 3/2002 | Senyk |
| 6,441,679 B1 | 8/2002 | Ohshima |
| 6,489,831 B1 | 12/2002 | Matranga |
| 6,496,056 B1 | 12/2002 | Shoji |
| 6,552,945 B2* | 4/2003 | Cooper et al. ......... 365/212 |
| 6,554,469 B1 | 4/2003 | Thompson |
| 6,567,763 B1 | 5/2003 | Javanifard et al. |
| 6,612,738 B2* | 9/2003 | Beer et al. ......... 374/183 |
| 6,635,934 B2 | 10/2003 | Hidaka |
| 6,674,185 B2 | 1/2004 | Mizuta |
| 6,679,628 B2 | 1/2004 | Breinlinger |
| 6,736,540 B1 | 5/2004 | Sheehan et al. |
| 6,737,848 B2 | 5/2004 | Goetz |
| 6,774,653 B2 | 8/2004 | Gold |
| 6,794,921 B2 | 9/2004 | Abe |
| 6,870,357 B1 | 3/2005 | Falik |
| 6,890,097 B2 | 5/2005 | Tanaka |
| 6,914,470 B2 | 7/2005 | Watanabe |
| 6,957,910 B1 | 10/2005 | Wan |
| 6,977,849 B2 | 12/2005 | Tomishima |
| 7,216,064 B1* | 5/2007 | Pippin ......... 703/1 |
| 7,417,487 B2* | 8/2008 | Mori ......... 327/512 |
| 7,595,244 B1* | 9/2009 | Bulucea et al. ......... 438/290 |
| 2001/0021217 A1* | 9/2001 | Gunther et al. ......... 374/178 |
| 2003/0025514 A1 | 2/2003 | Benes |
| 2003/0076158 A1 | 4/2003 | Rajan |
| 2003/0086476 A1 | 5/2003 | Mizuta |
| 2004/0208227 A1* | 10/2004 | Hauenstein ......... 374/178 |
| 2005/0179575 A1* | 8/2005 | McLeod et al. ......... 341/144 |

* cited by examiner

ON CHIP TEMPERATURE MEASURING AND MONITORING METHOD

CROSS REFERENCE TO RELATED APPLICATIONS

The present application is related to U.S. patent application Ser. No. 12/061,696, entitled "ON CHIP TEMPERATURE MEASURING AND MONITORING METHOD" to Robert L. FRANCH et al., filed coincident herewith; a divisional application of U.S. patent application Ser. No. 11/867,338, entitled "ON CHIP TEMPERATURE MEASURING AND MONITORING CIRCUIT AND METHOD" to Robert L. FRANCH et al., filed Oct. 4, 2007, and of U.S. patent application Ser. No. 11/747,620, entitled "ON CHIP TEMPERATURE MEASURING AND MONITORING CIRCUIT AND METHOD" to Robert L. FRANCH et al., filed May 11, 2007, and of U.S. Pat. No. 7,255,476 entitled "ON CHIP TEMPERATURE MEASURING AND MONITORING CIRCUIT AND METHOD" to Robert L. FRANCH et al., all assigned to the assignee of the present invention and incorporated herein by reference.

BACKGROUND OF THE INVENTION

1. Field of the Invention

The present invention is related to integrated circuits (ICs) and more particularly to circuits and methods of measuring and monitoring device temperature on ICs.

2. Background Description

It is well known that diode current can be approximated by $I=I_0(e^{qV/kT}-1)$, where $I_0$ is the diode turn on current, q is the charge magnitude, V is the junction bias voltage, k is the Boltzmann's constant and T is junction temperature. Similarly, field effect transistor (FET) characteristics, including threshold voltage ($V_T$), device drain to source current ($I_{ds}$) and leakage currents are related to the temperature of the material (e.g., semiconductor) embodying the FET by well known relationships. In a typical integrated circuit (IC), individual circuit device currents combine to drive capacitive loads at circuit nodes. So, if local (device or junction) temperature is known, device current and, correspondingly, circuit performance can be calculated very precisely. Consequently, an accurate device model requires an accurate device current description.

Current through semiconductor (e.g., silicon) junctions and devices generates heat locally. On a typical IC chip, each such junction or device may act as a local heat source and, more particularly, as a point heat source. How heat is conducted away from each point source depends upon its surrounding and thermally connected structures. For example, how the point source cools may depend in part on whether the circuit is in bulk silicon (Si) or silicon on insulator (SOI), whether the heat source is a single isolated device on a silicon island or is one heat source amongst a group of heat sources, whether metal directly contacts the heat source and etc. Glass (Si/SiO) is a poor heat conductor. So, circuits and even individual devices on a silicon island may be thermally insulated from each other, even though they reside on the same chip. Unfortunately, heat dissipation in modern SOI is not well understood. Previously, only crude imprecise temperature measurements have been available, e.g., chip level thermal measurements or using thermal imaging to characterize circuit-wide temperatures. Measuring gate resistance has provided the temperature of a structure one or two layers above the device active region, the region of concern and, still provides a somewhat distorted reflection of the channel temperature. So, for example, each junction/device is simulated, normally, at the same temperature as every other junction/device on the same circuit or a chip.

Further, device temperature may vary depending upon its immediate history. For example, a device in memory select logic may be switched on after several cycles of dormancy and so, may add little to ambient temperature. By contrast a device in a multiplexor may be switching aperiodically, making a variable contribution to ambient; an inverter in a clock buffer may be switching every cycle, cumulatively contributing to ambient and, itself being at a significantly higher temperature than ambient.

Consequently, because so little information is available about instantaneous thermal conditions at and for any particular device, normally, device current is modeled at one or more particular temperatures, e.g., nominal and both expected extremes. In addition, because it has been difficult, if not impossible, to characterize heat variations other than for large areas, individual device temperature and thermal time constants are not well known. However, without an accurate description of these parameters, e.g., a temperature to time relationship, it has not been possible to construct thermally accurate device models, much less monitor local circuit/device temperature during actual operation, e.g., to signal a shut down when device temperature exceeds an acceptable limit.

Thus, there is a need for an accurate characterization of IC structure temperatures and for a way to monitor junction and device temperatures during chip operation.

SUMMARY OF THE INVENTION

It is a purpose of the invention to improve semiconductor device models;

It is another purpose of the invention to accurately model device temperature in integrated circuits (ICs);

It is yet another purpose of the invention to accurately determine device operating temperature;

It is yet another purpose of the invention to monitor device temperature in real time and on the fly.

The present invention relates to a device temperature measurement circuit, an integrated circuit (IC) including a device temperature measurement circuit, a method of characterizing device temperature and a method of monitoring temperature. The circuit includes a constant current source and a clamping device. The clamping device selectively shunts current from the constant current source or allows the current to flow through a PN junction, which may be body to source/drain junction of a field effect transistor (FET). Voltage measurements are taken directly from the PN junction. Junction temperature is determined from measured junction voltage.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
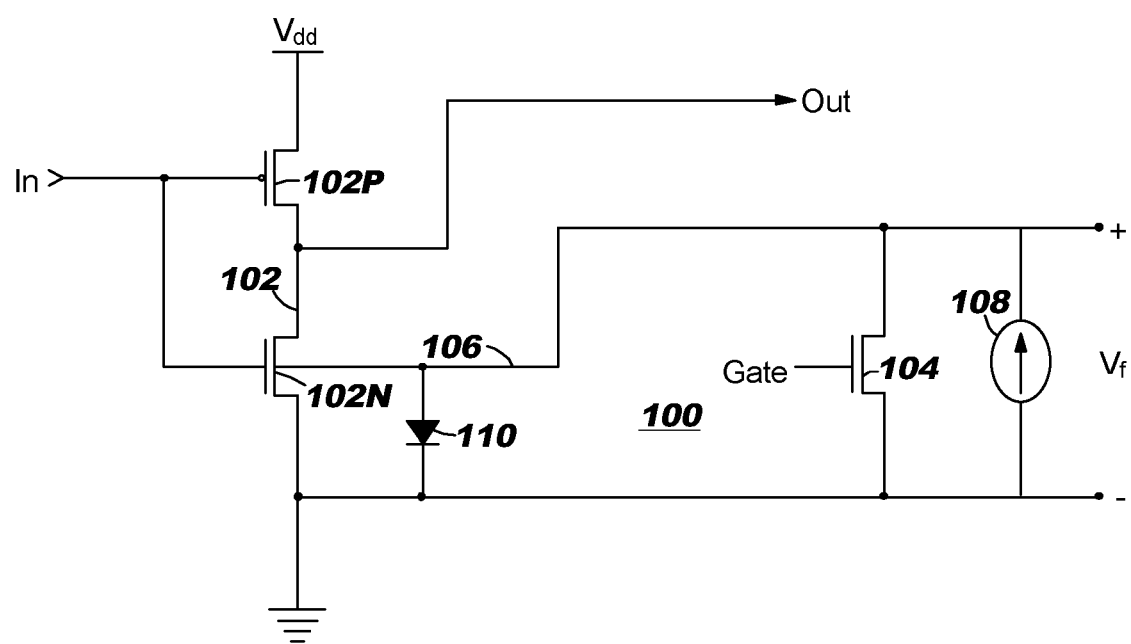
FIG. 1 shows an example of a device temperature measurement circuit as applied to a typical inverter.

Turning now to the drawings and, more particularly, FIG. 1 shows an example of a device temperature measurement circuit 100 according to a preferred embodiment of the present invention, as applied to a typical inverter 102. In particular, a preferred embodiment device temperature measurement circuit 100 measures the temperature of the particular device itself, which may be well above ambient. Further, the present invention has application both to characterization of temperature related device characteristics and to device temperature monitoring. This particular example is described with reference to application in a typical insulated gate complementary field effect transistor (FET) circuit (inverter 102) in what is commonly referred to as CMOS; and, more particularly, with reference to silicon on insulator (SOI), wherein devices are formed in P-type and N-type semiconductor (silicon) surface islands on an insulator (oxide) layer. However, the present invention has application to characterization and modeling in any suitable technology with an isolatable, contactable body, e.g., Silicon on sapphire. Further, a preferred embodiment device temperature measurement circuit 100 can be in a separate characterization circuit or, included in an actual circuit and used for auto-sensing, e.g., where it may be advantageous to monitor a critical functional device for excessive heating.

In this example, the inverter 102 includes an N-type FET (NFET) 102N and a P-type FET (PFET) 102P. A clamping NFET 104 is connected to the body 106 of inverter NFET 102N. A constant current source 108, preferably in the range of 10 µA-100 nA and located on chip, is connected in parallel with the clamping NFET 104 to the body 106 of inverter NFET 102N, the device being characterized/monitored for temperature. Constant current source 108 may be, for example, an NFET current-mirror circuit. A diode 110 represents the natural PN junction between the body and the source of the NFET 102N in this example. Essentially, inverter NFET 102N heats up during use and that heat is reflected in the forward bias voltage ($V_f$) of diode 110. By forcing a known current through the diode 110 with NFET 102N off and measuring the voltage across the diode 110 ($V_f$) at various temperatures, a voltage to temperature relationship is defined for the diode. Thereafter, the junction temperature may be determined from the diode voltage at the same current. During normal operation, clamping NFET 104 is switched on, shunting the current from current source 108 and clamping the body 106 of inverter NFET 102N, more or less, to ground. Junction temperature may be monitored, periodically, by switching off both NFETs 102N, 104 and measuring junction voltage. Of course, it is understood that the present invention has application to any suitable circuit including, for example, complex logic circuits such as adders, multiplexers, repeaters, etc.

Figure 2:
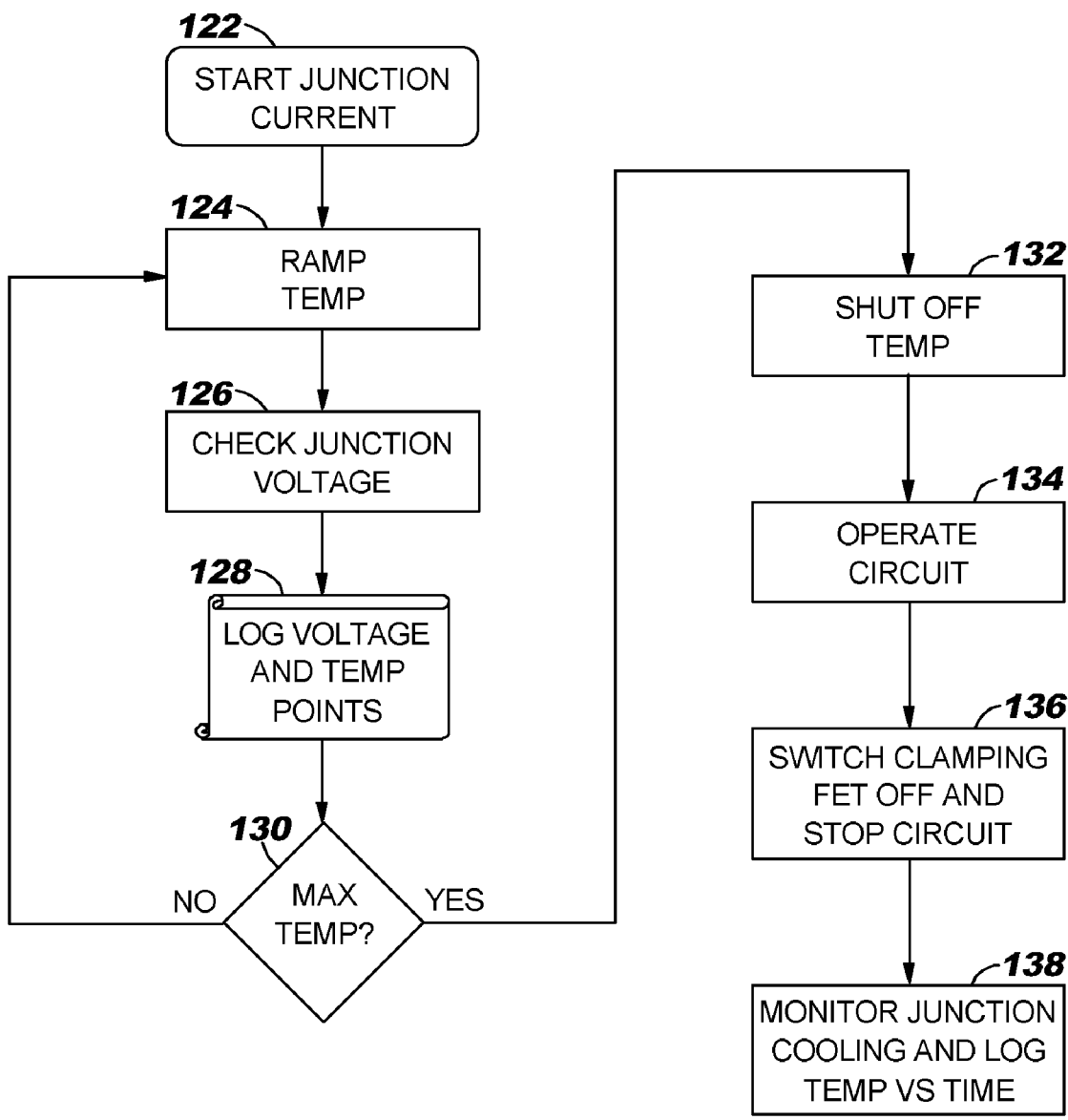
FIG. 2 shows an example of how to determine a relaxation thermal time constant for a suitable device model.

FIG. 2 shows an example 120 of how to determine a relaxation thermal time constant for a suitable device model according to a preferred embodiment of the present invention. First, beginning in step 122 chip junctions are calibrated, for example, using a hot-chuck or temperature chamber. Next, in step 124 the temperature of the chip, wafer, etc., is elevated or ramped with the inverter NFET 102N and clamping NFET 104 held off. In step 126, the junction voltage across the junction diode 110 is measured at multiple temperatures, e.g., by measuring voltage across the current source 108 and, correspondingly, the voltage across clamping NFET 104. After each measurement in step 128 the voltage-temperature for the junction is logged in a calibration table to very precisely relate junction temperature and voltage for that particular device. In step 130, if the maximum temperature has not been reached, calibration is still underway and returning to step 124 ramping continues. Once the maximum test temperature is reached in step 130 and calibration and resulting calibration table are complete. The clamping NFET 104 is switched on in step 132, and the hot chuck or temperature chamber is allowed to cool to room temperature.

The resulting voltage-temperature calibration table can be used with a preferred embodiment device temperature measurement circuit (e.g., 100) to generate a temperature based relaxation curve and determine a relaxation thermal time constant for the particular device, e.g., 102N. Essentially, the circuit (inverter 102) is operated at its highest expected capacity with the switch dormant and temperature is monitored over a selected cooling period. The relaxation thermal time constant may be used to model the device or similar devices. So, turning on the clamping NFET 104 shunts current from current source 108 and provides a ground bias to the body 106 of inverter NFET 102N. Then, in step 134 the inverter 102 is switched, e.g., at maximum operating frequency. After sufficient time for the junction to reach an expected maximum operating temperature, in step 136 the switching inverter 102 is stopped and the clamping NFET 104 is switched off. Finally, in step 138 the junction voltage measured at regular intervals using an on-chip A/D converter. The digital output of the A/D converter (not shown) can be stored or sent off chip where the measurements are logged. Thereafter, the logged voltage measurements may be converted to temperature using the voltage-temperature calibration table. The converted information may be used in the junction model for a much more precise accurate device model.

Figure 3A:
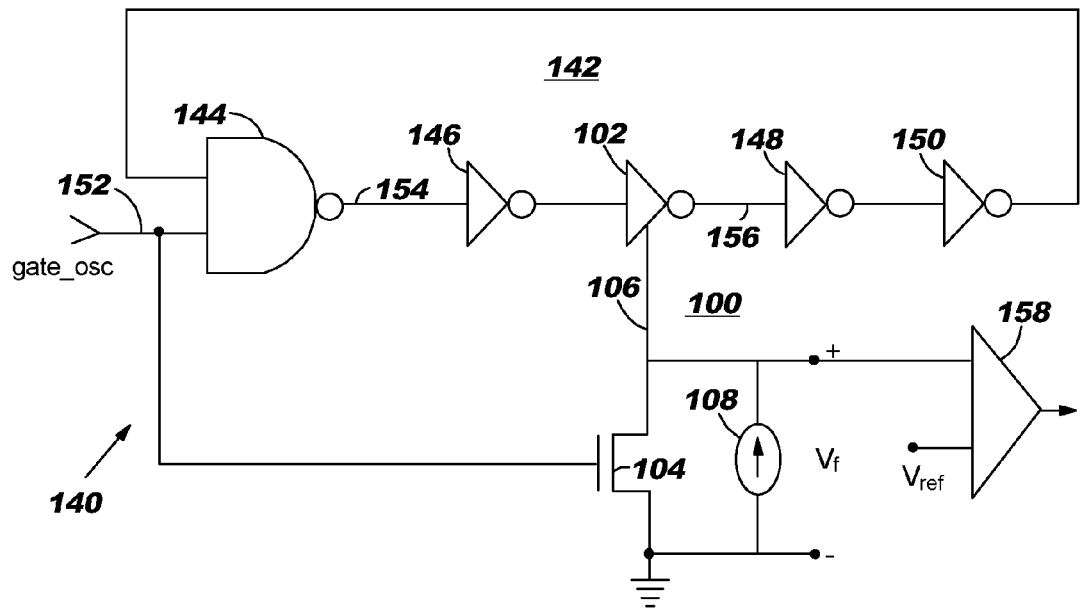
FIG. 3A shows an example of a ring oscillator that includes a device temperature measurement circuit substantially as described in FIG. 1.

FIG. 3A shows an example of a simple circuit implementation 140 of a preferred embodiment device temperature measurement circuit, e.g., 100 in FIG. 1, in a ring oscillator 142. The ring oscillator 142 of this example includes 5 inverting stages 144, 146, 102, 148 and 150. One stage 144 is a NAND gate and the remaining stages 146, 102, 148 and 150 are inverters. An enable or gating signal (gate_osc) 152 is a common input to the NAND gate 144 and the gate of clamping NFET 104. The NAND gate output 154 is in phase with measurement circuit inverter output 156. The voltage ($V_f$) may be provided to an over-temp circuit 158 for selectively generating an alarm when an over-temperature condition is detected. Over-voltage circuit 158 may be, for example, a simple comparator for comparison against a reference voltage ($V_{ref}$) or, as noted hereinabove, an A/D converter.

Figure 3B:
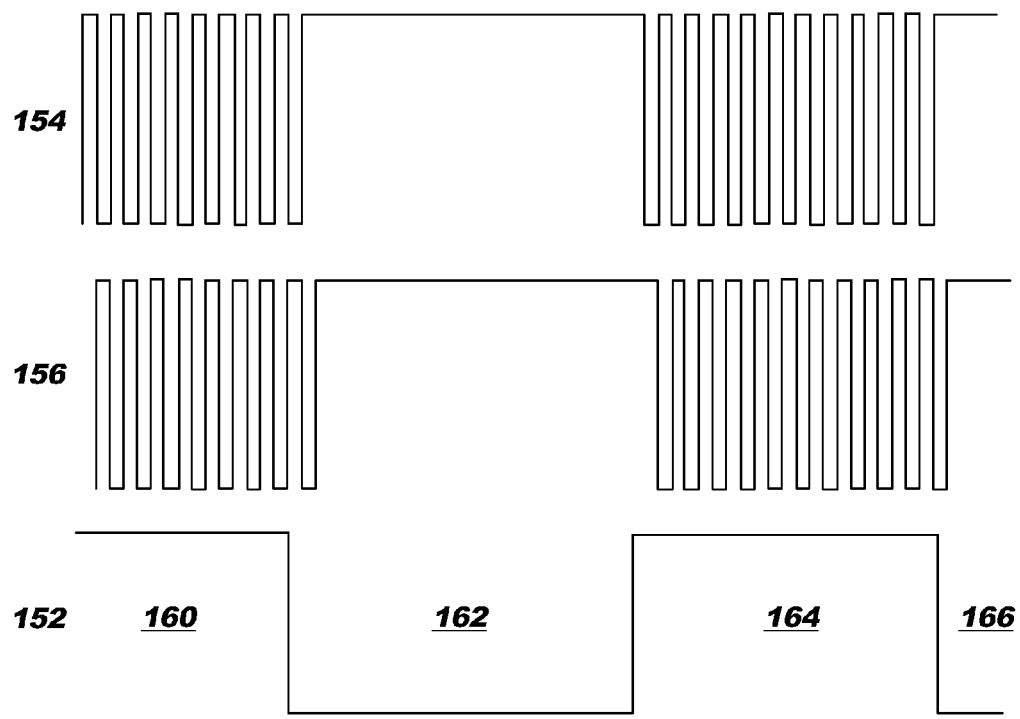
FIG. 3B shows a timing diagram for a simple example of using the circuit of FIG. 3A for measuring and monitoring chip/circuit temperature, e.g., in a microprocessor.

FIG. 3B shows a timing diagram for a simple example of using the circuit of FIG. 3A for measuring and monitoring chip/circuit temperature according to a preferred embodiment of the present invention, e.g., in a microprocessor. First, in period 160 with the gating signal 152 high, the clamping NFET 104 is on, shunting current from current source 108; and, NAND gate 144 inverts the output of inverter 150. So, the oscillator 142 is free running. After sufficient time for the inverter junction to heat to its steady state operating temperature, in period 162 the gating signal 152 is dropped, which turns clamping NFET off and simultaneously forces the output 154 of NAND gate 144 high, stopping the oscillator. The output 156 of inverter 102 is high and a voltage ($V_f$) develops across the junction at 106 in response to the current from current source 108. As noted above, the voltage ($V_f$) may be provided, for example to a comparator 158. The comparator may trigger an over temperature alarm (also not shown), whenever the voltage ($V_f$) indicates that the temperature exceeds a maximum allowed value. Thereafter, e.g., if no alarm is triggered or if the alarm does not result in halting the oscillator 100 (e.g., for cooling), in period 164 the gating signal 152 may be raised so that the oscillator resumes oscillating. The measurement may be repeated in 166 at some selected future time, e.g., periodically or upon request.

Advantageously, the forward voltage ($V_f$) of the P-N junction (and therefore its temperature) may be sensed immediately and on the fly. Thus, the temperature of the device itself (which may be well above ambient) is being individually determined and time sensitive temperature data is not lost, e.g., due to line charging delays from using an external current source or from transient settling time delays. Sensing can be either off-chip or on-chip using an analog comparator or, an A/D converter in combination with a digital compare and a scannable typical threshold value. The result is much more accurate than measuring neighboring device temperatures and trying to extrapolate temperature for the actual device of interest. Instead, application of the present invention measures the actual device temperature in the actual logic gate. Temperature can be monitored in any circuit, even on a device embedded in an IC chip mounted in a module in active operation, e.g., a microprocessor in a computer.

While the invention has been described in terms of preferred embodiments, those skilled in the art will recognize that the invention can be practiced with modification within the spirit and scope of the appended claims.

What is claimed is:

1. A method of modeling a field effect transistor (FET) in a circuit on an integrated circuit (IC) chip, said FET being modeled for varying temperature, said method comprising:
   determining a voltage to temperature relationship for a PN junction at a known current, said PN junction being a body to source/drain junction of a FET included in an inverter in a ring oscillator including said inverter and;
   operating said FET normally; and
   stopping oscillation of said ring oscillator and measuring voltage across said PN junction, measured said voltage indicating the instantaneous temperature of said PN junction, a device temperature model being derived from indicated said instantaneous temperature.

2. A method of modeling said FET as in claim 1, wherein determining said voltage to temperature relationship for the PN junction comprises:
   ramping temperature on said PN junction;
   providing said known current to said PN junction from an on-chip current source; and
   measuring voltage across said PN junction until a maximum selected temperature is reached.

3. A method of modeling said FET as in claim 2, wherein providing said known current, said voltage is periodically measured.

4. A method of modeling said FET as in claim 1, wherein operating the FET normally comprises reducing current provided from an on-chip current source to said PN junction.

5. A method of modeling said FET as in claim 4, wherein said on-chip current source is a constant current source and reducing current comprises shunting said constant current source, whereby voltage across said PN junction is below a turn on point for said PN junction.

6. A method of modeling said FET as in claim 1, wherein measuring comprises halting operation of said FET.

7. A method of modeling said FET as in claim 1, wherein stopping said ring oscillator further comprises turning off a shunt shunting current from an on chip current source, said current flowing through said PN junction.

8. A method of modeling said FET as in claim 7, wherein stopping oscillation and measuring further comprises periodically measuring said voltage across said PN junction.

* * * * *